US006940297B2

(12) United States Patent
Hall

(10) Patent No.: US 6,940,297 B2
(45) Date of Patent: Sep. 6, 2005

(54) TOP PLATE RELEASE MECHANISM

(76) Inventor: James Hall, 5576 Castlebar Pl., Alta Loma, CA (US) 91737

( * ) Notice: Subject to any disclaimer, the term of this patent is extended or adjusted under 35 U.S.C. 154(b) by 226 days.

(21) Appl. No.: 10/445,748

(22) Filed: May 27, 2003

(65) Prior Publication Data

US 2004/0242037 A1 Dec. 2, 2004

(51) Int. Cl.[7] ............................................... G01R 31/02
(52) U.S. Cl. ........................ 324/754; 439/135; 324/755
(58) Field of Search ............................. 439/135, 136, 439/133, 134; 324/158.1, 158 F, 158 P, 158, 761, 754–755

(56) References Cited

U.S. PATENT DOCUMENTS

| | | | | |
|---|---|---|---|---|
| 4,667,155 A | * | 5/1987 | Coiner et al. ............... | 324/754 |
| 4,797,610 A | | 1/1989 | Fombellida | |
| 4,857,009 A | | 8/1989 | Christensen | |
| 5,087,878 A | * | 2/1992 | Belmore et al. ............ | 324/754 |
| 5,157,325 A | * | 10/1992 | Murphy ...................... | 324/761 |
| 5,214,374 A | * | 5/1993 | St. Onge .................... | 324/754 |
| 5,422,575 A | * | 6/1995 | Ferrer et al. ................ | 324/754 |
| 5,436,567 A | | 7/1995 | Wexler et al. | |
| 5,500,606 A | * | 3/1996 | Holmes ...................... | 324/761 |
| 5,550,481 A | * | 8/1996 | Holmes et al. ............. | 324/754 |
| 5,557,211 A | * | 9/1996 | Ferrer et al. ................ | 324/754 |
| 6,054,869 A | * | 4/2000 | Hutton et al. ............... | 324/754 |
| 6,084,422 A | * | 7/2000 | Bartholomew ............. | 324/761 |
| 6,469,495 B1 | * | 10/2002 | Boswell et al. ........... | 324/158.1 |

* cited by examiner

Primary Examiner—P. Austin Bradley
Assistant Examiner—Phuongchi Nguyen
(74) Attorney, Agent, or Firm—Lewis M. Brande; Thomas A. McCleary; Brande & McCleary

(57) ABSTRACT

A top plate release mechanism that comprises a sliding portion that forces locking tabs that are mounted in a mounting bracket to be dislocated to a releasing position, in order to allow a top plate to easily be removed from a probe plate assembly. The top plate release mechanism comprises biasing means to maintain the mechanism in a locked position until the sliding portion is moved. The top plate release mechanism may also comprise a locking feature that fixedly locks the release mechanism to prevent the locking tabs from prematurely returning to a locked position.

5 Claims, 6 Drawing Sheets

TOP PLATE RELEASE MECHANISM

BACKGROUND OF THE INVENTION

1. Field of the Invention

This invention relates generally to the method of latching a top plate commonly used in a testing apparatus for printed circuit boards.

2. Background of the Invention

It is not uncommon for automatic test fixtures to use a vacuum box system to test printed circuit boards. Generally, a printed circuit board is placed into a vacuum box fixture, where the test probes have been pre-set for the specific circuit board to be tested, and a top plate is placed over the board. A vacuum is applied and the circuit board comes into contact with the test probes, allowing the board's circuit components to be tested. Each test box must be customized for the specific circuit boards since each designed circuit board has the components and "wiring" in specific locations. Each vendor of a circuit board varies its design causing the requirement of differing setups of automatic test fixtures.

In the past, Top (Moving or Diaphragm) Plates were held in place by means of a removable Dress Frame. This was a five-sided piece of aluminum with the center removed except for about ½ inch on all four sides. The resulting picture frame like item contained two small holes in a front vertical wall and two small holes in a rear vertical wall. The resulting picture frame like item would slip over the Top and Bottom (Probe) plate stack and be held in position via four protruding pins, where the protruding pins would be aligned with the four holes in the front and rear vertical walls. The industry used this method for a long time but eventually moved away from this approach largely because of a new approach to sealing the void between the Top and Bottom plates. It should also be noted, that a common complaint about the removable dress frame was that once you removed it to allow removal of the Top Plate to access the Probe Plate, you would need to find a place to temporarily store this bulky dress frame, where people wouldn't trip over it or damage it.

The next generation of a Top Plate "hold down" method, was to employ two or four locking pins. These locking pins would be located either in two or four corners of the Top Plate. There are at least two known drawbacks to this approach. First, all of the current methods result in protrusions or bumps in two or four corners of the Top Plate, which in some cases can cause interference with other hardware that may need to be attached to the Top Plate. Second the current methods could result in partial release or engagements, which can then cause the top plate to hang up upon removal or installation.

SUMMARY OF THE INVENTION

One object of the invention is to provide a new sliding latch system that will quickly install a top plate of an electronic testing apparatus.

Another object of the invention is to make the new sliding latch system easy for the user to install.

A third object of the invention is to make a sliding latch system that has a low profile, thereby preventing the user from "catching" objects on the latch, prematurely releasing the mechanism. An additional object of the invention is to provide a sliding latch system that is also ergonomically superior to existing latching systems. The low profile design not only gives a better appearance to the top surface of the automatic test fixture, but also allows the addition of any required hardware that needs to be mounted to the Top Plate without any interference from components of the test fixture.

The new latch system is easy to use regardless of the size of the fixture or the ability or strength of the operator. It supports consistent placement of the Top Plate and reduces the problems sometimes caused by other methods due to unsynchronized actions. To release the Top Plate, the operator simply rests their thumbs against the center of the slide bars and with a pushing action away from the operator, the mechanism releases and the Top Plate pops up to be lifted up and away from the fixture. To reinstall, the operator places the Top Plate back on the fixture with the aid of the four alignment pins, and pushes down on the Top Plate until the slide rails re-engage with the side rails.

DESCRIPTION OF THE PRIOR ART

U.S. Pat. No. 5,557,211 discloses a "Vacuum Test Fixture for Printed Circuit Boards." This patent describes that the fixture is designed to have a vacuum chamber disposed between a stationary probe plate and a movable top plate. Separate adjustable linear bearings are located at each of the four quadrants of the fixture and thereby provide parallel alignment between the moveable top plate and the probe plate. The top plate is secured to the probe plate by separate quick release latches that extend through the linear bearings. When the latches are released the top plate moves in a directional plane aligned to the plane of the top plate aligning the board under test with the probe field. The latch mechanism shown in the '211 patent is described as having a U-shaped guide frame which surrounds the head of the guide post above the top plate. A spring loaded latch slides within the U-shaped guide. The latch is biased in the closed position, where an annular slot is engaged by the latch mechanism effectively securing the top plate, when all latches are such closed. The alternative method of latch mechanism is effectively the same, as a annular grove is use to latch the top plate into position. As described within the '211 patent, there are disclosed generally four (4) latches per specific top plate where depending upon the spring rate of the installed release springs, it could be very difficult to remove the latches, but in any case four separate latches must be released in order to remove the top plate from the test fixture.

BRIEF DESCRIPTION OF THE DRAWINGS

The invention is better understood by studying the cited embodiment illustrated in the appended drawings. These drawings depict only typical embodiments of the invention and are not therefore to be considered to be limiting of its scope. The invention will be described and explained with additional specificity and detail through the use of the accompanying drawings.

DETAILED DESCRIPTION

Figure 1:
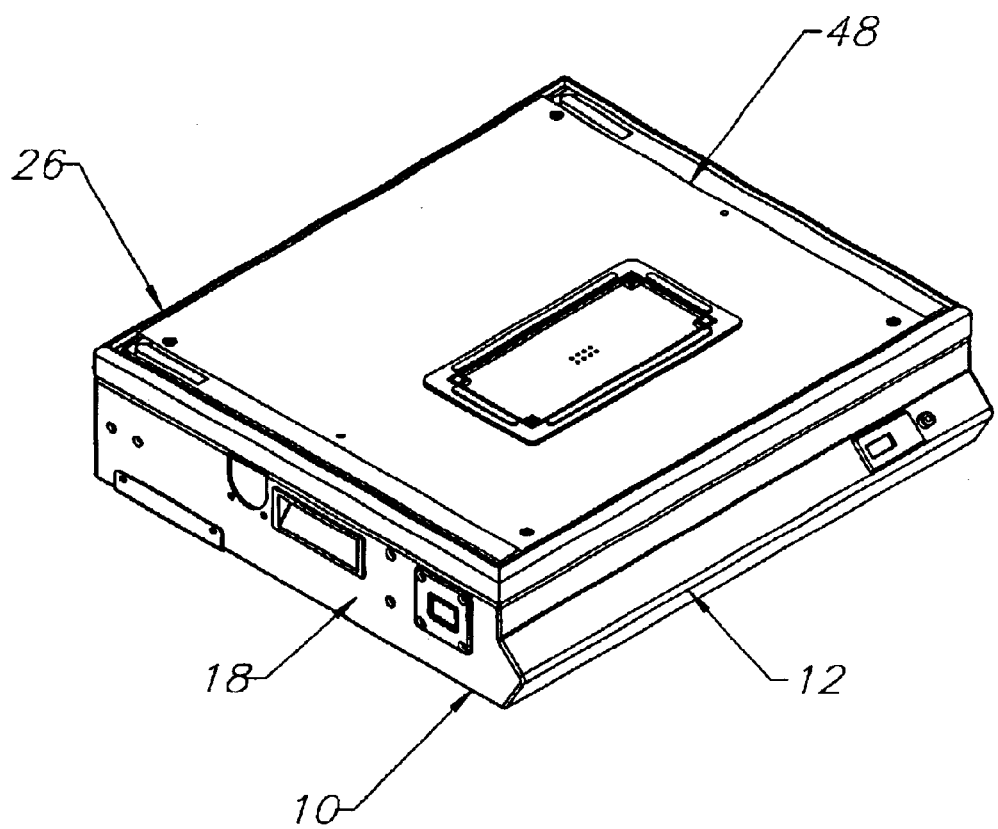
FIG. 1 is a perspective view of the top of the present invention.
Figure 2:
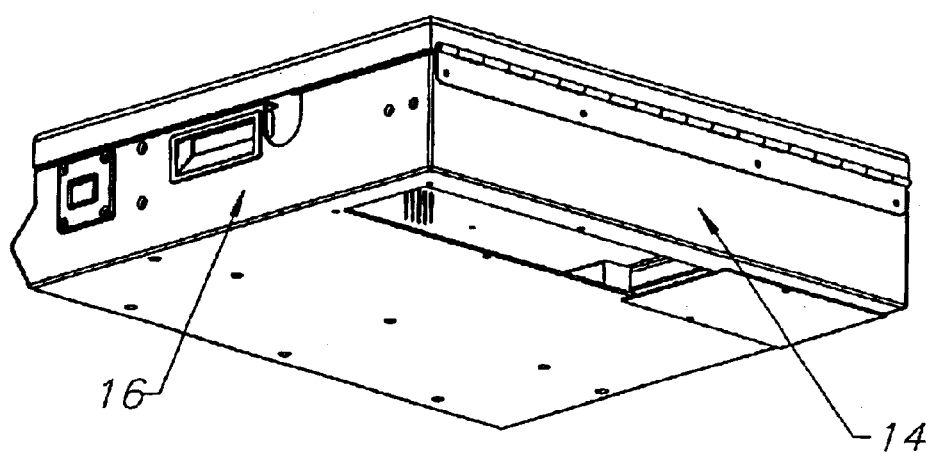
FIG. 2 is a perspective view of the bottom of the present invention.
Figure 3:
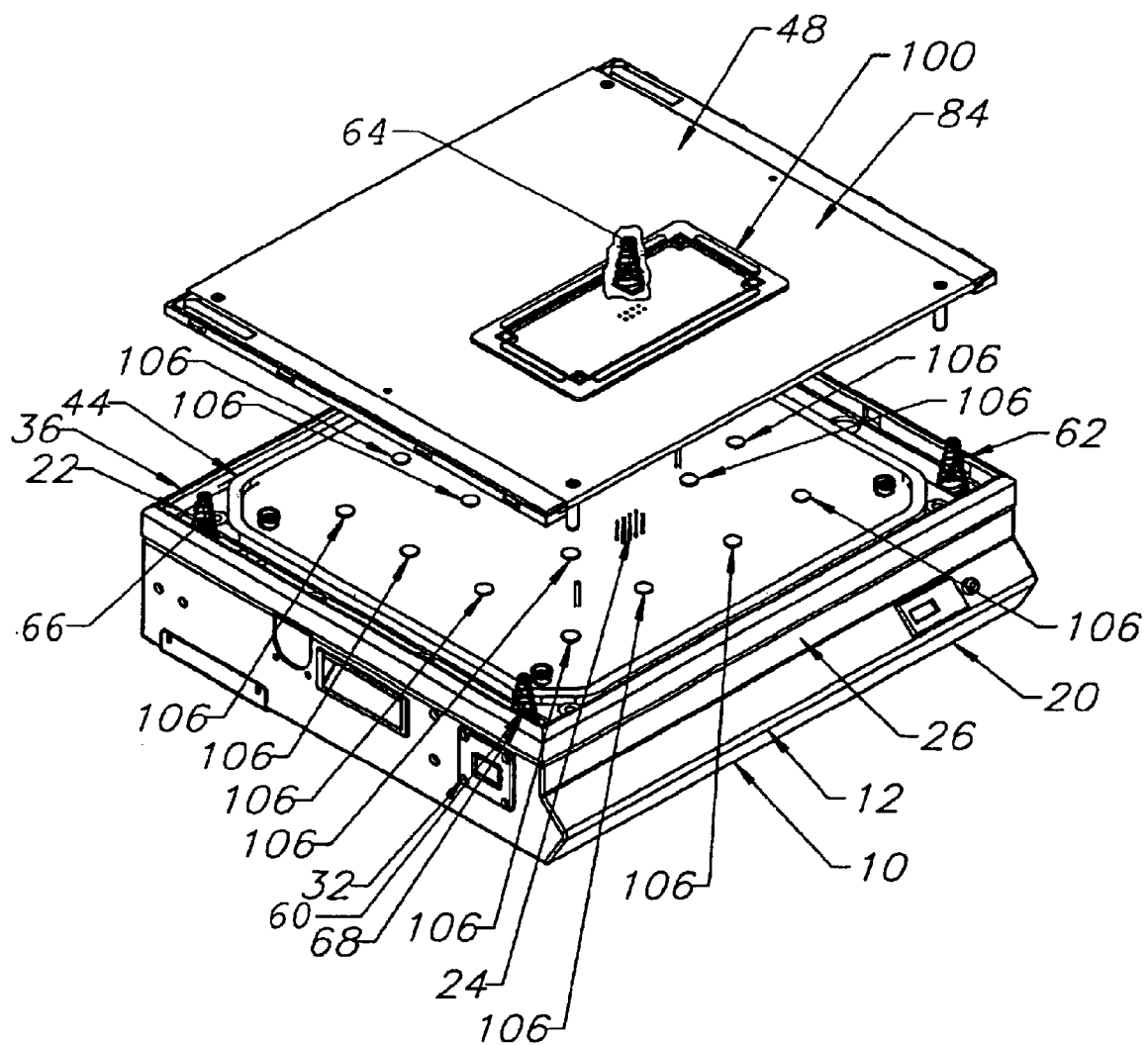
FIG. 3 perspective view of the top of the present invention with the top plate assembly exploded out.
Figure 4:
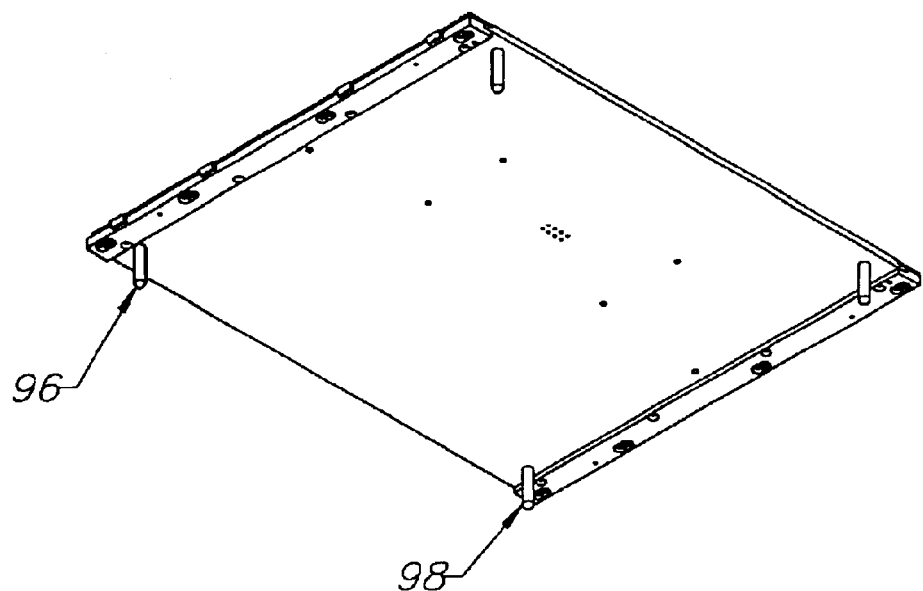
FIG. 4 is a perspective view of the bottom of the top plate assembly.
Figure 5:
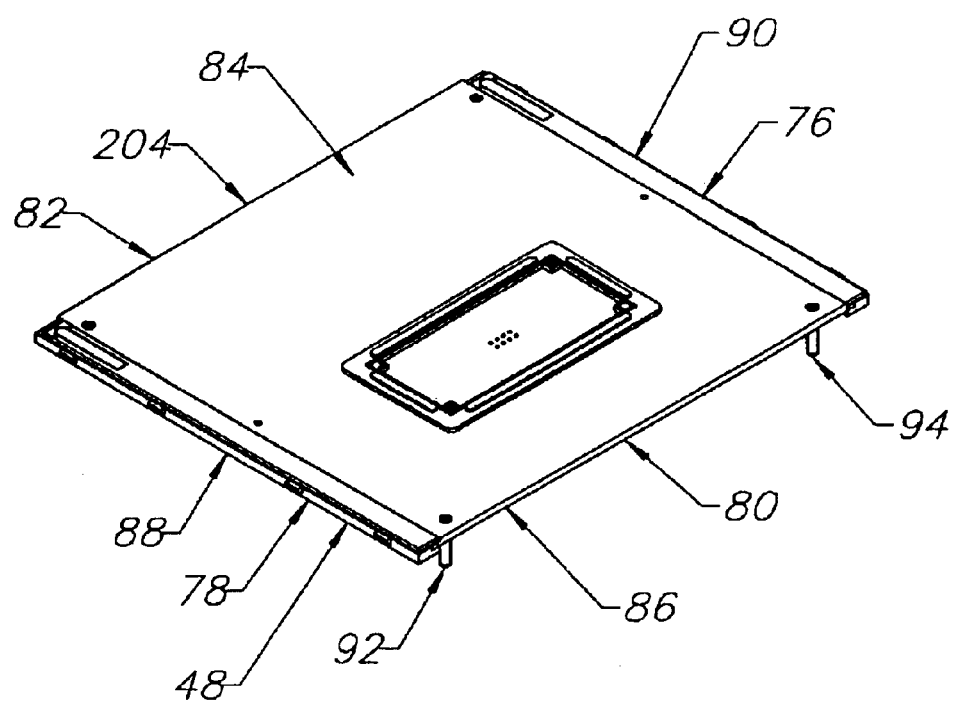
FIG. 5 is a perspective view of the top of the top plate assembly.
Figure 6:
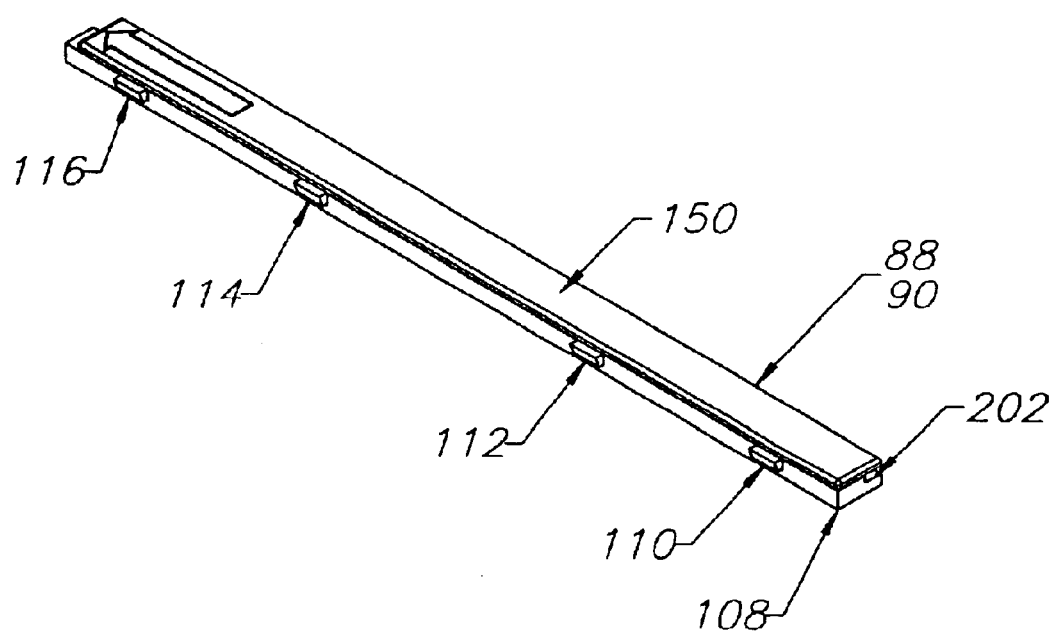
FIG. 6 is a perspective view of a latch slide assembly.
Figure 7:
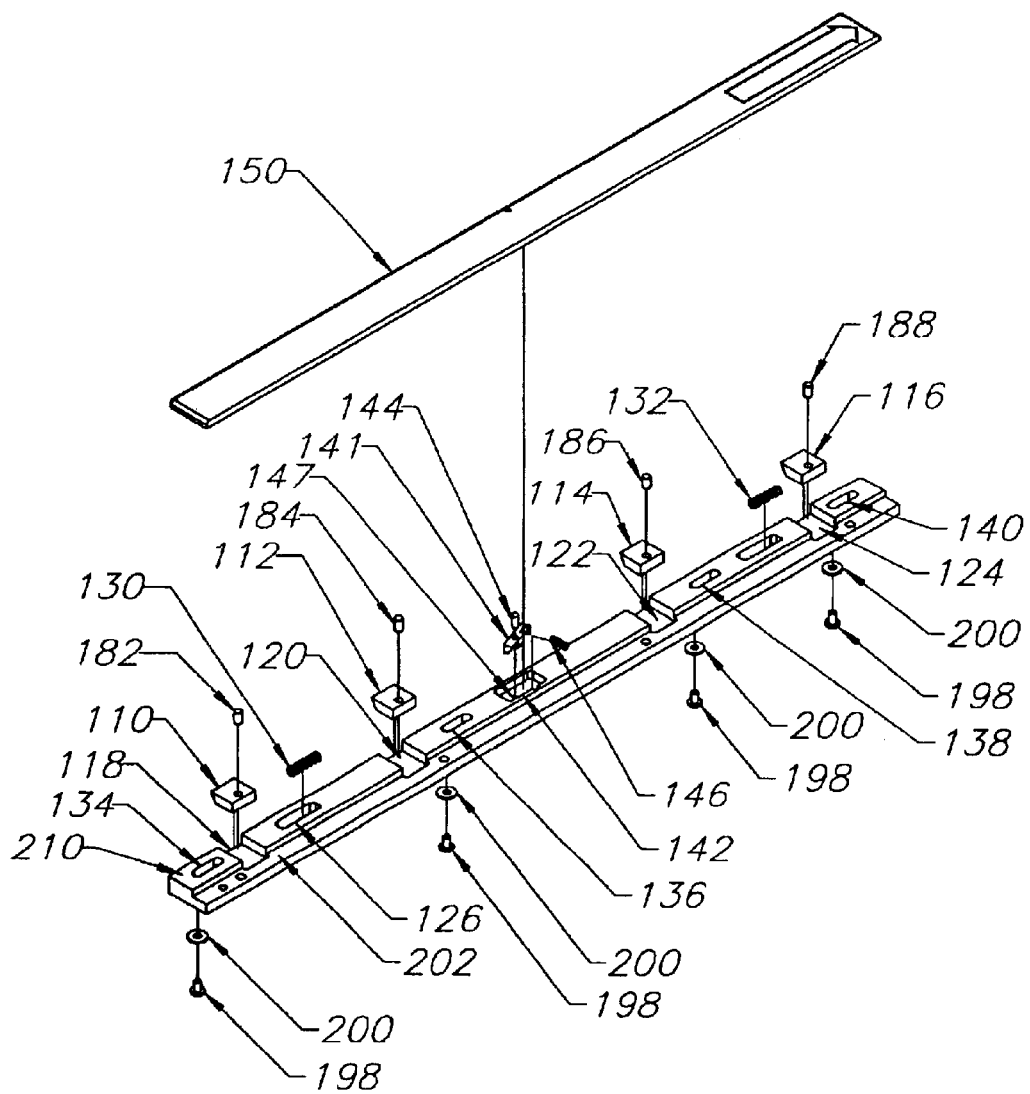
FIG. 7 is an exploded view of the top of the latch slide assembly.
Figure 8:
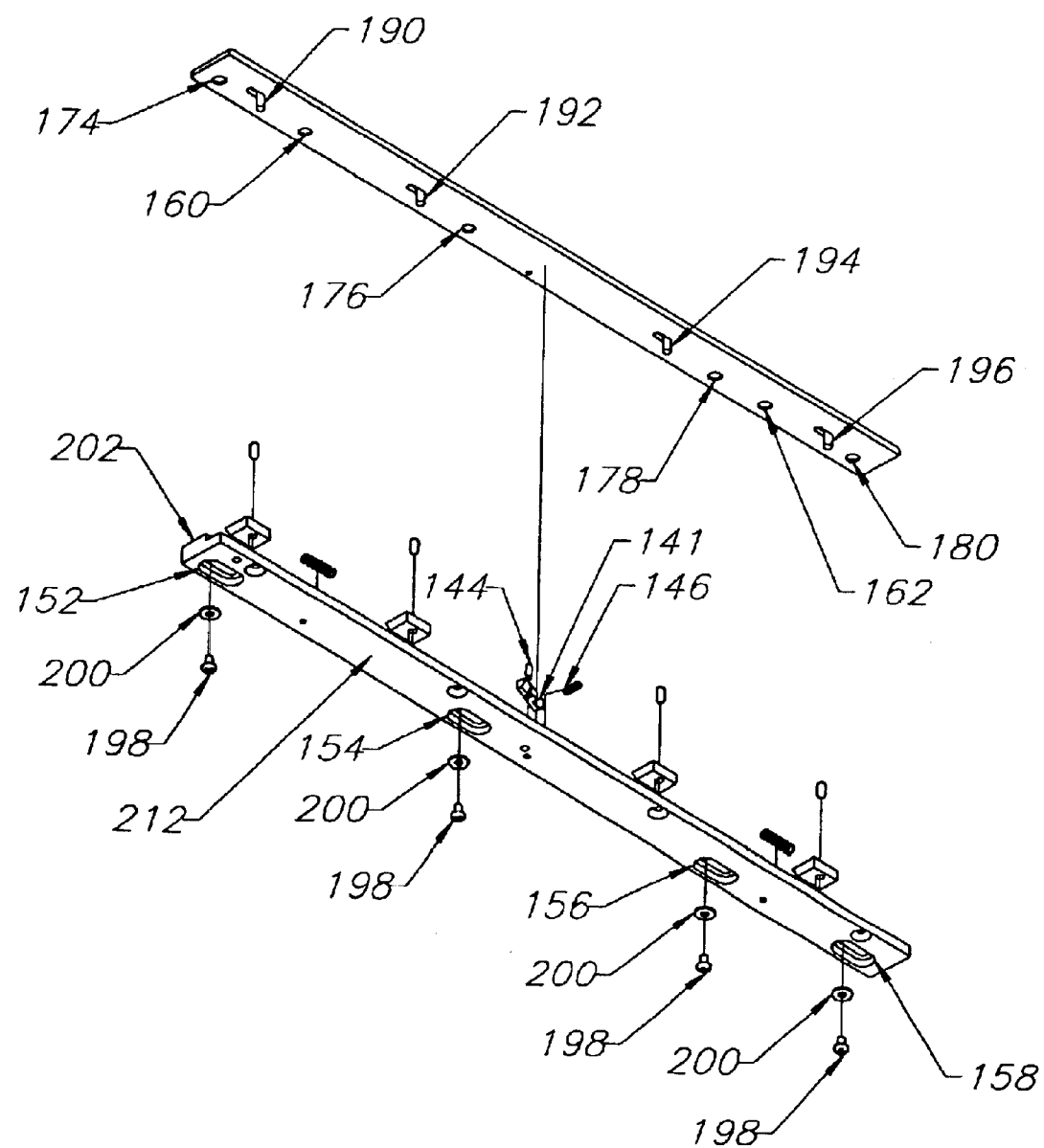
FIG. 8 is an exploded view of the bottom of the latch slide assembly.

The current invention, as depicted in FIG. 1, comprises an enclosure assembly (10) in the shape of a box having a front (12), a back (14), a right side (16), a left side (18) and a bottom (20).

The enclosure assembly (10) has a recessed cavity (22) defined therein. A probe plate assembly (26) is mounted in the recessed cavity (22). The probe plate assembly (26) has a plurality of spring-loaded test probes (24) mounted and positioned in the probe plate assembly (26). The test probes (24) extend upwards and pass through the probe plate assembly (26). Each of the plurality of test probes (24) is electrically connected to test wiring (228) and then an interface unit (226) mounted within the enclosure assembly (10) that is attached to a test panel (28). The plurality of test probes (24) are arranged for specific circuit boards (230) or units under test (uut).

The probe plate assembly (26) is hingeably attached to the enclosure assembly (10) by standard hinge means. A first latch (30) is attached to the right side (16) of the enclosure assembly (10). A second latch (32) is attached to the left side (18) of the enclosure assembly (10). The first and second latches (30,32) secure the probe plate assembly (26) onto the enclosure assembly (10).

The probe plate assembly (26) has a front rail (34), a rear rail (36), a left rail (38), a right rail (40) and a top (42). Resting on the top (42) of the probe plate assembly (26) is a gasket (44). The gasket (44) defines an interior (46) between the top (42), the gasket (44) and a top plate assembly (48), wherein a vacuum can be formed. The gasket (44) is spaced away from the front rail (34), the rear rail (36), the left rail (38), and the right rail (40) of the probe plate assembly (26), creating a gap (50) therebetween.

The probe plate assembly (26) has a first corner (52), a second corner (54), a third corner (56), and a fourth corner (56). Located the first corner (52) is a first biasing means (60), in the second corner (54) a second biasing means (62), in the third corner (56) a third biasing means (64), and in the fourth corner (56) a fourth biasing mean (66). The first, second, third, and fourth biasing means (60,62,64,66) prevent the top plate assembly (48) from being secured to the probe plate assembly (26) without the application of direct downward force. The probe plate assembly (26) has a first top plate alignment hole (68) located in the first corner (52), a second top plate alignment hole (70) located in the second corner (54), a third top plate alignment hole (72) located in the third corner (56), and a fourth top plate alignment hole (74) located in the fourth corner (58) of the probe plate assembly (26).

The top plate assembly (48) has a left side (76), a right side (78), a front (80), a rear (82), a top (84) and a bottom (86). A left latch assembly (88) is attached to the left side (76) of the top plate assembly (48) and a right latch assembly (90) is attached to the right side (78) of the top plate assembly (48). Mounted on the bottom (86) of the top plate assembly (48) is a first top plate guide pin (92), a second top plate guide pin (94), a third top plate guide pin (96), and a fourth top plate guide pin (98), where the first, second, third, and fourth top plate guide pins (92, 94, 96, 98) are located in positions complementary to the first, second, third, and fourth alignment holes (68,70,72,74) of the probe plate assembly (26). The first, second, third, and fourth top plate guide pins (92,94,96,98) of the top plate assembly (48) are slidably received into their respective top plate alignment holes (68,70,72,74).

At least two circuit board tooling pins (212, 214) are positioned on the top (42) of the probe plate assembly (26), and positioned relative to the plurality of test probes (24). The top plate (204) has at least a first circuit board tooling hole (216) and a second circuit board tooling hole (218) defined therein. The first circuit board tooling pin (212) and the second circuit board tooling pin (214), project upwards and are slidably inserted through the first circuit board tooling hole (216), and the second circuit board tooling hole (218) respectively projecting away from the top (84) of the probe plate assembly (48). A vacuum gasket (100) is used to position the unit under test (230). The vacuum gasket (100) may be made from an elastic material like rubber, which will allow the vacuum gasket (100) to deform when the unit under test (230) is positioned within the vacuum gasket (100). The vacuum gasket (100) provides a light friction fit to the unit under test (230) thereby maintaining a vacuum seal. The first and second circuit board tooling pins (212, 214) are additionally inserted through complimentary first and second circuit board tooling holes (216,218) in the unit under test (230) aligning the circuit board. Due to manufacturing tolerances, it is entirely possible that the vacuum gasket (100) will be slightly deformed when the unit under test (100) is aligned by the tooling pins (212,214). In order to guarantee a vacuum seal between the circuit board tooling pins (212, 214) and the first and second circuit board tooling holes (218, 220), a first and second tooling pin vacuum gasket (222,224) may be used. Downward force is applied to the top plate assembly (48), overcoming the force applied by the biasing means (60, 62, 64, 66) allowing the left and right latch assemblies (88, 90) to engage the left rail (38) and the right rail (40) of the probe plate assembly (26). The probe plate assembly (48) has a plurality of test probe apertures (220) defined therein. The plurality of test probes (24) are inserted through the plurality of test probe apertures (220) located in the top plate assembly (48) and come in contact with the circuitry on the unit under test (230) in predefined positions. The unit under test (230) is held in place by a friction fit to the vacuum gasket (100) on the top (84) of the probe plate assembly (48) and the first and second circuit board tooling pins (210, 212).

The probe plate assembly (26) has a at least one vacuum port (104) defined therein. A standard vacuum means (not shown) applies vacuum through the vacuum port (104) forcing the top plate assembly (48) towards the top (42) of the probe plate assembly (26) and thereby forces the plurality of test probes (24) to come into intimate electrical contact with the circuitry of the circuit board. (230) Interspaced on the top (42) of the probe plate assembly (26) is a plurality of top plate stops (106). The plurality of top plate stops (106) prevent the top plate assembly (48) from "bowing" (bending), due to the pressure differential caused by the vacuum, allowing the top plate assembly (48) to remain essentially planar while under vacuum, maintaining no flexure of the top plate assembly.

The left latch assembly (88) has a mounting bracket (108) attached thereon, the mounting bracket (108) having a top side (210) and a bottom side (212). The top side (210) of the mounting bracket (108) has a machined step (202) defined therein. The machined step (202) allows for a flush mounting of the left latch assembly (88) onto the top plate assembly (48). The top side (210) of the left latch assembly (88) has a first, second, third and fourth locking tab guide slot (118, 120, 122, 124) defined therein. The first, second, third and fourth locking tab guide slot (118, 120, 122, 124) are oriented transverse to the length of the left latch assembly. Positioned within the first, second, third and fourth locking tab guide slots (118, 120, 122, 124) are a first, second, third, and fourth locking tabs (110, 112, 114, 116). The top side (210) of the left latch assembly (88) has a first and second slide guide (126, 128) defined therein, the first and second slide guide (126, 128) being slots defined in the mounting bracket (108). Mounted within the first and second slide guides (126, 128) are a first and second slide return spring (130, 132), the first and second slide return spring (130, 132) being biased against a first and second latch slide return pin (160, 162). The first and second latch slide return pins (160, 162) are mounted on a bottom side (164) of a latch slide assembly (150).

The top side (210) of the mounting bracket (108) further has a first latch slide guide slot (134), a second latch slide guide slot (136), a third latch slide guide slot (138), and fourth latch slide guide slot (140) defined therein. The first latch slide guide slot (134) slidably receives a first guide boss (174), a second latch slide guide slot (136) slidably receives a second guide boss (176), a third latch slide guide slot (138) slidably receives a second guide boss (178), and a fourth latch slide guide slot (140) slidably receives a fourth guide boss (180), the first, second, third, and fourth guide bosses (174, 176, 178, 180) being mounted on the latch slide assembly (150).

The first locking tab (110) has a fifth boss (182) projecting upwards. Respectively, the second, third, and fourth locking tabs (112, 114, 116, 118), have a sixth, seventh, and eighth (184, 186, 188) boss, each projecting upwards. The bottom side (164) of the latch slide assembly (150) has a first angled locking tab guide slot (190), a second angled locking tab guide slot (192), a third angled locking tab guide slot (194), and fourth angled locking tab guide slot (196) defined therein. The fifth, sixth, seventh, and eighth (182, 184, 186, 188) bosses are each slidably received in the first, second, third, and fourth angled locking tab guide slot (190, 192, 194, 196) respectively.

The first (110), second (112), third (114), and fourth (116) locking tabs are each slidably positioned into a first (118), second (120), third (122), and fourth (124) locking tab guide slots. The locking tab guide slots (118,120,122,124) allow the locking tabs (110, 112, 114, 116) to translate transverse to the length of the left latch assembly. The latch slide assembly (150) is placed on top of the mounting bracket (108). The fifth (182), sixth (184), seventh (186), and eighth (188) boss on the first (110), second (112), third (114), and fourth (116) locking tabs are slidably received in the first (190), second (192), third (194), and fourth (196) angled locking tab guide slots respectively. The first (126) and second (128) latch slide guides are positioned within the first (134) and second (136) latch slide guide slots. The first (126) and second (128) latch slide guides are positioned by a first (130) and second (132) slide return springs and biased to a locked position, where the locked position is defined by the first locking tab (110), second locking tab (112), third locking tab (114), and fourth locking tab (116) being in an extended position, allowing the first locking tab (110), second locking tab (112), third locking tab (114), and fourth locking tab (116) to be inserted into the fifth, sixth, seventh, and eighth locking tab guide slots (166,168,170,172) located on the probe plate assembly (26).

The first (174), second (176), third (178), and fourth (180) guide bosses are slidably positioned into the first (134), second (136), third (138), and fourth (140) latch guide slots located on the mounting bracket (108). The latch slide assembly (150) is slidably attached to the mounting bracket (108) using conventional screws (198) and washers (200), where the screws (198) and washers (200) are threadably engaged in the first (174), second (176), third (178), and fourth (180) guide bosses. The bottom side (212) of the mounting bracket (108) has a first (152), second (154), third (156), and fourth (158) guide slots defined therein, where the first (152), second (154), third (156), and fourth (158) guide slots allow the screws (198) and washers (200) to be recessed therein. The right latch assembly (90) is made as a mirror opposite to the left latch assembly (88). The left latch assembly (88) and the right latch assembly (90) are attached to a top plate (204) creating a top plate assembly (48). The latch slide assembly (150) may be slidably moved, since the mounting bracket (108) of the left latch assembly (88), and the right latch assembly (90) are attached to the top plate (204). The sliding action of the latch slide assembly (150) thereby forces the first (110), second (112), third (114), and fourth (116) locking tabs to be retracted via the first (190), second (192), third (194), and fourth (196) angled locking tab guide slots. The first (60), second (62), third (64), and fourth (66) biasing means, or springs, push the top plate assembly (48) away from the probe plate assembly (25) allowing the user to remove the top plate assembly (48) and the mounted circuit board (230).

A second embodiment of the top plate release mechanism includes a locking and release feature integral to the latch mechanism as herein described.

The top side (210) of the mounting bracket (108) has a slide lock groove (142) defined therein. The mounting bracket (108) has a second pivot hole (147) defined therein. A slide lock (141) has a first pivot hole (148) defined therein. A slide lock hinge pin (144) is pivotably inserted through the first pivot hole (148) defined in the slide lock (141), and allowed to seat in the second pivot hole (147) located in the mounting bracket (108). The slide lock (141) has a spring notch (143) defined therein. A slide lock return spring (146) pivotably biases the slide lock (141) in a locked position. The slide lock (141) has a chamfer (145) located an end opposing the spring notch (143). The mounting bracket (108) additionally has a lock activation hole (149) defined therein. The lock activation hole (149) being positionally located under the chamfer (145) on the slide lock (141). The latch slide assembly (150) has a latch slide lock pin (206) located on the bottom surface (164) of the latch slide assembly (150). The latch slide lock pin (206) slides between the slide lock (141) and the slide lock groove (142), and when the latch slide assembly (150) is at its forward most position, the slide lock return spring (146) biases the slide lock (141) against the slide lock groove (142) and prevents the slide latch assembly (150) from returning to its rearmost position.

An actuating pin (208) is positioned on the probe plate assembly (26) and in line with the lock activation hole (149) in the mounting bracket (108). When the top plate assembly (48) is positioned on the probe plate assembly (26), the actuating pin (208) is inserted into the lock activation hole (149), and bears against the chamfer (145) pivotably dislocating the slide lock (141) from its rest position, and allowing the latch slide lock pin (206) to slide to its rearmost position, allowing the first (110), second (112), third (114), and fourth (116) locking tabs to be inserted into corresponding locking tab guide slots (166,168,170,172) positioned on the left and right rails (38,40) of the probe plate assembly (26).

Although the foregoing includes a description of the best mode contemplated for carrying out the invention, various modifications are contemplated.

As various modifications could be made in the constructions herein described and illustrated without departing from the scope of the invention, it is intended that all matter contained in the foregoing description or shown in the accompanying drawings shall be interpreted as illustrative rather than limiting.

What is claimed is:

1. A top plate release mechanism, comprising:

a. top plate assembly, said top plate assembly having a top plate, a left latch assembly, and a right latch assembly, said top plate assembly having a left side, a right side, a front a rear, a top and a bottom, a left latch assembly being fixedly connected to said left side of said top plate assembly, a right latch assembly, said right latch assembly being fixedly connected to said right side of said top plate assembly;

b. said top plate assembly having a plurality guide pins, said plurality of guide pins being located on said bottom of said top plate assembly, said plurality of guide pins positionally and slideably locating said top plate assembly into an enclosure assembly;

c. said left latch assembly has a latch slide assembly, said latch slide assembly being slideably attached to a mounting bracket, said latch slide assembly being biased to a locking position by a biasing means, said left latch assembly having a plurality of locking tabs, each of said plurality of locking tabs having a mechanical attach means to said latch slide assembly, said mounting bracket further having a plurality of locking tab guide slots, each of said plurality of locking tabs being located in said plurality of locking tab guide slots respectfully, said plurality of locking tabs protrude from said mounting bracket and slideably lock into a probe plate assembly, said probe plate assembly being hingeably attached to said enclosure assembly;

d. a plurality of biasing means are compressibly located in said probe plate assembly bearing against said bottom of said top plate assembly;

e. forward sliding action of the latch slide assembly retracts said plurality of locking tabs located in said top plate assembly, said top plate assembly being a component of said probe plate assembly, which slideably lock into said enclosure assembly, said plurality of biasing means forcing said top plate assembly away from said probe plate assembly, allowing removal of said top plate assembly; and f. said right latch assembly being an opposite to said left latch assembly and operating in the same manner to said left latch assembly, said right latch assembly being opposite handedly attached to said right side of said top plate.

2. The top plate release mechanism of claim 1 wherein said plurality of guide pins comprises a number of at least 3.

3. The top plate release mechanism of claim 1 wherein;

a. said left latch slide assembly having a bottom and a top, said bottom of said left latch slide assembly having a plurality of angled locking tab guide slot, said plurality of angled locking tab guide slots, being angled away from a longitudinal axis of sliding motion of said left latch slide assembly;

b. said bottom of said left latch slide assembly further having a plurality of latch slide return pins, said mounting bracket having a plurality of slide guides defined therein, said plurality of slide guides being equal in number to said plurality of slide return pins, said plurality of slide return pins being inserted into said plurality of said slide guides, a plurality of slide return springs bearing against said plurality of slide return pins, maintaining said left latch slide assembly in a locked position;

c. said plurality of locking tabs each having a boss defined thereon, each of said bosses located on each of said locking tabs are each slideably inserted into said plurality of angled guide slots respectfully whereby forward motion of said left latch slide assembly retracts said plurality of locking tabs;

d. said left latch slide assembly is attached to said mounting bracket with an attaching means, said mounting bracket having a plurality of latch guide slots defined therein, said attaching means being positioned within said plurality of latch guide slots, allowing free forward lateral motion;

e. said mounting bracket having a machined step defined therein, said machined step allowing for a flush type of installation of said latch assembly onto said top plate; and f. said right latch assembly being attached to said top plate in a like manner.

4. The top plate release mechanism of claim 1 wherein;

a. said plurality of locking tabs comprises a number of at least 3;

b. said plurality of locking tab guide slots comprises a number of at least 3;

c. said plurality of bosses located on said plurality of locking tab guide slots comprises a number of at least; and d. said plurality of angled locking tab guide slots comprises a number of at least 3.

5. The top plate release mechanism of claim 3, wherein;

a. said mounting bracket has a slide lock groove defined therein, said mounting bracket additionally has a first pivot hole defined therein, said first pivot hole being located within said slide lock groove;

b. a slide lock, said slide lock having a hole defined therein, a slide lock hinge pin, said slide lock hinge pin being pivotably inserted through said hole positioned in said slide lock, and being allowed to seat in said first pivot hole located in said slide lock groove;

c. said slide lock further has a biasing notch defined therein, a biasing means forces said slide lock into a locked position, said slide lock has a chamfer defined therein, said chamfer being located on an end opposing said biasing notch;

d. said mounting bracket additionally having a lock activation hole defined therein, said lock activation hole being positionally located below said chamfer on said slide lock, e. said latch slide assembly having a latch slide lock pin, said latch slide lock pin being located on said bottom of said latch slide assembly, said latch slide lock pin being slideably positioned between said slide lock and said slide lock groove, said biasing action of said biasing means forces said slide lock to a position that prevents said slide latch assembly from returning to said locking position; and f. said probe plate assembly has an actuating pin positioned thereon, said actuating pin being oriented with said slide lock activation hole located in said mounting bracket, said actuating pin being inserted through said activation hole and bearing against said chamfer on said slide lock, pivotably dislocating said slide lock from a rest position, allowing said latch slide lock pin to slideably dislocate to its rearmost position, forcing said plurality of locking tabs to be inserted into their respective locking tab guide slots located on said probe plate assembly.

* * * * *